(12) United States Patent
Higuchi

(10) Patent No.: US 7,084,065 B2
(45) Date of Patent: Aug. 1, 2006

(54) METHOD FOR FABRICATING A SEMICONDUCTOR DEVICE

(75) Inventor: Kenichi Higuchi, Aichi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/303,743

(22) Filed: Nov. 26, 2002

(65) Prior Publication Data

US 2003/0162397 A1   Aug. 28, 2003

(30) Foreign Application Priority Data

Feb. 28, 2002 (JP) ............................ 2002-054303

(51) Int. Cl.
*H01L 21/311* (2006.01)

(52) U.S. Cl. ............... 438/701; 438/623; 438/627; 438/629; 438/637; 438/694; 438/700; 257/E21.49

(58) Field of Classification Search ............... 438/620, 438/623, 624, 627, 629, 631, 633, 637, 643, 438/645, 694, 696, 700, 701, 734, 744, 906; 257/E21.49

See application file for complete search history.

(56) References Cited

U.S. PATENT DOCUMENTS

| 5,405,492 A | * | 4/1995 | Moslehi ..................... 438/694 |
| 5,952,246 A | * | 9/1999 | Wang et al. ................ 438/724 |
| 6,177,347 B1 | * | 1/2001 | Liu et al. .................... 438/675 |
| 6,720,249 B1 | * | 4/2004 | Dalton et al. ............... 438/624 |

OTHER PUBLICATIONS

Wolf et al., Silicon Processing for the VLSI Era, vol. 1: Process Technology, 1986 Lattice Press, pp. 168, 171-173 and 191-194.*

* cited by examiner

Primary Examiner—George Fourson
Assistant Examiner—Julio J. Maldonado
(74) Attorney, Agent, or Firm—Westerman, Hattori, Daniels & Adrian, LLP.

(57) ABSTRACT

A method for fabricating a semiconductor device that prevents the formation of a side etch caused by fluoride ($CF_x$) produced when a barrier insulating film is etched. As shown in FIG. 1(G), an opening in the shape of a wiring trench is made in an interlayer dielectric. Then, as shown in FIG. 1(H), a barrier insulating film is etched. As a result, fluoride will be produced. By performing plasma etching by the use of gas which contains hydrogen atoms in the following process shown in FIG. 1(I), the fluoride is converted to a highly volatile compound, such as hydrogen fluoride, and is removed.

5 Claims, 17 Drawing Sheets

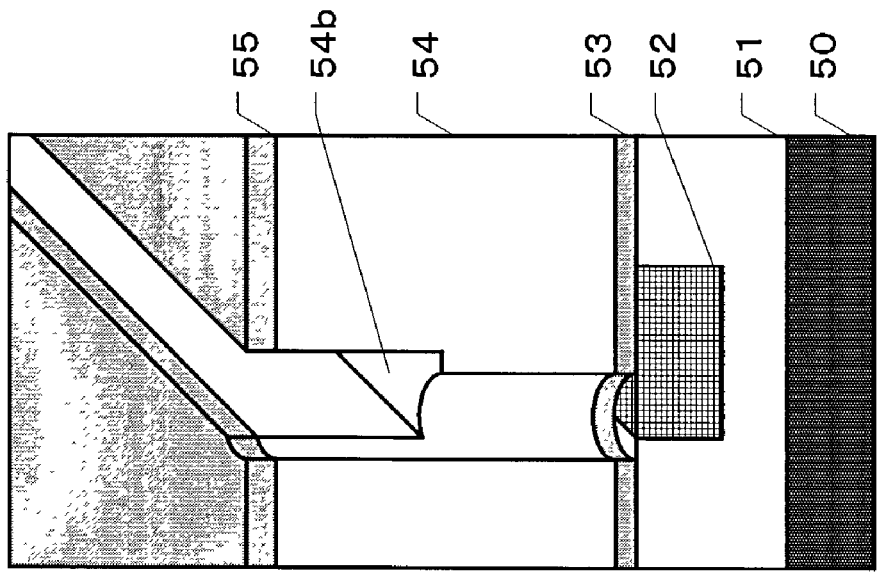
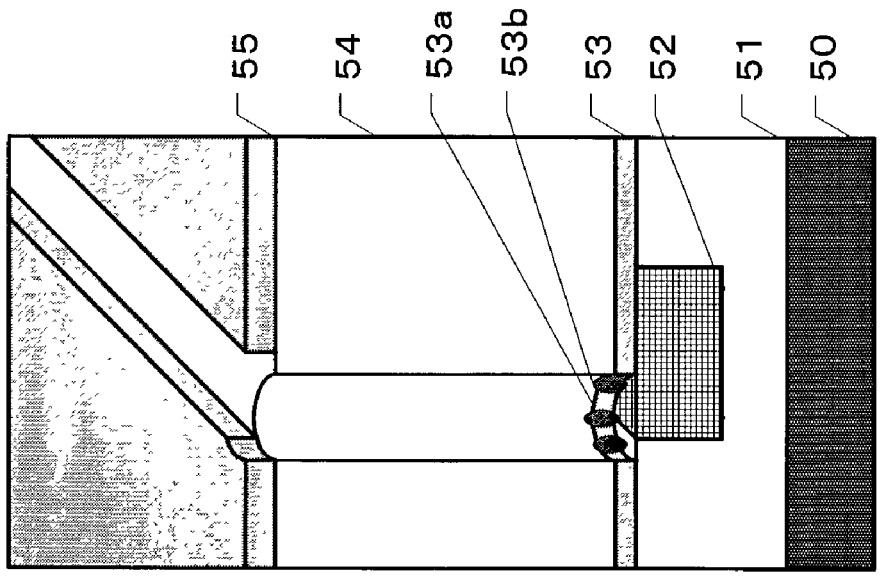
FIG. 4(A)
FIG. 4(B)

METHOD FOR FABRICATING A SEMICONDUCTOR DEVICE

CROSS-REFERENCE TO RELATED APPLICATION

This application is based upon and claims the benefit of priority from the prior Japanese patent applications No. 2002-54303, filed Feb. 28, 2002, the entire contents of which are incorporated herein by reference.

BACKGROUND OF THE INVENTION (1) Field of the Invention

This invention relates to a method for fabricating a semiconductor device and, more particularly, to a method for fabricating a semiconductor device in which a dual damascene method is used.

(2) Description of the Related Art

Minute semiconductor devices have been produced in recent years. The minuter semiconductor devices become, the narrower wiring width and a space between wirings get. Therefore, wiring resistance and parasitic capacitance between wirings increase. This will reduce signal speed and prevent semiconductor devices from operating at high speeds according to the scaling law.

In order to decrease wiring resistance and parasitic capacitance between wirings, methods for forming multilayer wirings, an insulating material, and a metal wiring material must be reviewed. Insulating materials with a small dielectric constant are effective in decreasing wiring capacitance. Moreover, to decrease wiring resistance, a metal wiring material is shifting from aluminum to copper with low resistivity.

It is difficult to apply conventional dry etching to fabricating copper films, so damascene methods are used. Damascene methods are divided broadly into a single damascene method and dual damascene method. With the single damascene method, plugs (vias) which connect a lower wiring and an upper wiring and wirings are formed by different processes. With the dual damascene method, plugs and wirings are formed at one time.

The minuter semiconductor devices become, the greater the number of wiring layers in them gets. For example, the number of wiring layers in semiconductor devices which belong to a generation having a wiring width of 0.18 μm is six. In this case, similar processes are repeated, for example, twelve times (six times for forming wirings and six times for forming plugs) in the single damascene method. On the other hand, similar processes are repeated only six times in the dual damascene method.

As described above, wirings and plugs can be formed at one time in the dual damascene method. As a result, the number of processes in the dual damascene method is half of that of processes in the single damascene method. Therefore, to lower production costs and improve production efficiency, it is advantageous to adopt the dual damascene method. Furthermore, with the dual damascene method, contact resistance between a lower wiring and a plug connected thereto is low and it is easy to avoid bad contact between them. As a result, the reliability of wirings will improve.

FIGS. 8(A) through 8(M) are views showing a method for fabricating a semiconductor device in which a conventional dual damascene method is used. A plurality of films, such as an insulating film and metal film, are formed first on a lower wiring layer according to FIGS. 8(A) through 8(C). The lower wiring layer is made in the following way.

First, a silicon dioxide film ($SiO_2$ film) 22, organic insulating film 23, and silicon dioxide film 24 are formed on a silicon substrate 21. In this case, the silicon dioxide film 22 with a thickness of 200 nm and the silicon dioxide film 24 with a thickness of 100 nm are formed by a plasma CVD method.

The organic insulating film 23 with a thickness of 400 nm is formed by the use of, for example, Allied-Signal's FLARE 2.0, being an insulating material having a low dielectric constant, by a spin coat method. Allied-Signal's FLARE 2.0 is an aromatic polymer with a dielectric constant of 2.8 lower than 4.1, being the dielectric constant of a silicon dioxide film, and can withstand temperatures higher than 400° C. In this example, Allied-Signal's FLARE 2.0 is used as the organic insulating film 23. However, Dow Chemical's SILK, being a hydrocarbonaceous polymer, or the like can be used. Another substance, such as resin which contains hydrocarbon, fluorine, or the like, may be used as material for the organic insulating film 23.

To form a first wiring layer in the organic insulating film 23 and silicon dioxide film 24 formed in this way, first the silicon dioxide film 24 is coated with a photoresist film, being a photosensitive polymer, and a window for a wiring pattern is formed through exposure treatment and development treatment. An opening of a wiring shaped pattern is made in the silicon dioxide film 24 through this window by etching, such as a plasma etching method. Then a portion of the organic insulating film 23 which is exposed from the opening for a wiring in the silicon dioxide film 24 is removed by a plasma etching method to make an opening of a wiring shaped pattern. The organic insulating film 23 is etched in an atmosphere where $O_2$ gas and Ar gas are introduced. An etchant used in this case is oxygen, so the organic insulating film 23 and photoresist film are etched selectively in relation to the silicon dioxide films 22 and 24 and the silicon dioxide film 24 is not etched. However, the photoresist film is etched by oxygen, so the etching of the organic insulating film 23 and the removal of the photoresist film can be performed at one time.

A wiring trench in the first wiring layer consists of the opening in the silicon dioxide film 24 and the opening in the organic insulating film 23 formed through the above patterning treatment. The opening in the organic insulating film 23 is right beneath the opening in the silicon dioxide film 24.

Next, a barrier metal film 25 of TiN or TaN, the melting point of which is high, with a thickness of 50 nm is formed by sputtering on the inner surface of the wiring trench formed in this way and the surface of the silicon dioxide film 24 and then a copper (Cu) film 26 with a thickness of 800 nm is formed in the same way on the barrier metal film 25 by sputtering.

There will be irregularities on the surface of the copper film 26. Therefore, to flatten the surface of the copper film 26, anneal treatment is performed on the copper film 26 at 400° C. in an atmosphere of hydrogen at a pressure of 0.1 torr for five minutes. As a result of this anneal treatment, the copper film 26 will completely be buried in the wiring trench.

Then the copper film 26 is polished by a chemical mechanical polishing (CMP) method to leave the copper film 26 only in the wiring trench. This copper film 26 is the first wiring layer.

By performing the above treatment, a structure shown in FIG. 8(A) will be obtained.

Subsequently, as shown in FIG. 8(B), a plurality of films, such as insulating films and metal films, described below are formed on the copper film 26 and silicon dioxide film 24. That is to say, a silicon nitride film 30 with a thickness of 50 nm is formed on the copper film 26 and silicon dioxide film 24 by a plasma CVD method. A silicon dioxide film 31 with a thickness of 600 nm is formed on the silicon nitride film 30 by a plasma CVD method. Moreover, an organic insulating film 32 with a thickness of 400 nm is formed on the silicon dioxide film 31 by a spin coat method. In this case, one of the above materials used for the organic insulating film 23 is selected for forming the organic insulating film 32.

Then a silicon dioxide film 33 with a thickness of 100 nm is formed on the organic insulating film 32 by a plasma CVD method. A silicon nitride film 34 with a thickness of 100 nm is formed on the silicon dioxide film 33 by a plasma CVD method.

After the above films being formed, as shown in FIG. 8(C), the silicon nitride film 34 is coated with a photoresist 35 and exposure treatment and development treatment are performed on the photoresist 35 to form a window. An opening for a wiring 34a having a shape corresponding to a second wiring layer is made in the silicon nitride film 34 by a photolithographic method in which the photoresist 35 is used as a mask (see FIG. 8(D)).

Then the photoresist 35 is ashed by oxygen plasma and is removed. As shown in FIG. 8(E), the surface of the silicon nitride film 34 and the inside of the opening 34a are coated with a photoresist film 36 and exposure treatment and development treatment are performed on the photoresist film 36 to form a window, which is in the opening for a wiring 34a and which is opposite to part of the first wiring layer, in the photoresist film 36. This window has a shape corresponding to a contact via. Then, as shown in FIG. 8(F), the silicon dioxide film 33 is etched through the window in the photoresist film 36 to make an opening 33a having a shape corresponding to the contact via.

As shown in FIG. 8(G), anisotropic plasma etching with oxygen and argon is performed on the organic insulating film 32 through the opening 33a after the above etching to form an opening 32a there. By performing this etching, the photoresist film 36 is also etched and removed. Therefore, the process for removing only the photoresist film 36 is unnecessary and the organic insulating film 32 will not be etched unnecessarily.

Subsequently, as shown in FIG. 8(H), the silicon dioxide film 33 is etched through the opening 34a into the shape of a wiring by plasma etching using gas which contains fluorine with the silicon nitride film 34 as a mask to make an opening 33b. During this etching the organic insulating film 32 is used as a mask and the silicon dioxide film 31 beneath it is also etched through the opening 32a in the organic insulating film 32. As a result, an opening 31a is made in the silicon dioxide film 31 simultaneously with the opening 33b.

Then the organic insulating film 32 is etched through the opening 34a in the silicon nitride film 34 into the shape of the wiring by oxygen plasma. As a result, an opening for a wiring 32b shown in FIG. 8(I) is made there. The opening for a wiring 32b in the organic insulating film 32, together with the opening for a wiring 33b in the silicon dioxide film 33, will be used as a wiring trench in the second wiring layer.

Subsequently, as shown in FIG. 8(J), plasma etching is performed on the silicon nitride film 30 beneath the opening 31a by the use of $C_4F_8$ gas and $O_2$ gas with the silicon dioxide film 31 as a mask to make an opening 30a there. The opening 30a in the silicon nitride film 30 and the opening 31a in the silicon dioxide film 31 are used as a contact via hole and part of wirings on the first wiring layer will get exposed in the bottom of the contact via hole.

Subsequently, as shown in FIG. 8(K), a barrier metal film 37 of TiN or TaN with a thickness of 50 nm is formed by sputtering on the inner wall of a concave portion formed in the above way.

Subsequently, as shown in FIG. 8(L), the lower half of a copper film 38 with a thickness of 100 nm is formed by sputtering and the upper half of the copper film 38 with a thickness of 1500 nm is formed on it by an electroplating method. Then anneal treatment is performed on the copper film 38 at 400° C. in an atmosphere of hydrogen for thirty minutes. As a result of this anneal treatment, particles in the copper film 38 will grow and the reliability of wirings will improve.

Subsequently, as shown in FIG. 8(M), the copper film 38 is polished by a CMP method to leave the copper film 38 only in the wiring trench in the second wiring layer and the contact via hole. A copper film in the wiring trench in the second wiring layer (the upper half of the copper film 38) is used as a wiring and a copper film left in the contact via hole (the lower half of the copper film 38) is used as a plug.

One of the problems caused by adopting the dual damascene method is defective burying of the copper film 38. Raising the coverage of the barrier metal film 37 is considered as a measure to cope with this problem.

By the way, the coverage of the barrier metal film 37 depends on a shape into which a wiring trench or connection hole is fabricated. For example, if a side etch occurs in the silicon nitride film 30, an overhang will appear in a connection hole. As a result, when the copper film 38 is formed, a void 40 shown in FIG. 9 will be created.

A side etch in the silicon nitride film 30 is corrosion caused by the reaction between reaction products (fluoride expressed by $CF_x$) which are produced when the silicon nitride film 30 is etched and the silicon nitride film 30. If after etching the silicon nitride film 30 is left in the air as it is, then moisture in the air will accelerate this corrosion. The reason for this is as follows. Hydrogen fluoride (HF) is produced from fluorine (F) contained in the reaction products $CF_x$ and moisture in the air and corrosion occurs. Then a layer which has changed in quality due to the reaction is removed by wet cleaning in the next process.

FIGS. 10(A), 10(B) and 11 are views for describing the cause of the occurrence of the side etch. As shown in FIG. 10(A), it is assumed that time from the etching of the silicon nitride film 30 to wet cleaning is TIME#1, that time from the wet cleaning to the checking, that is to say, the measuring of its section is TIME#2, and that time from the etching of the silicon nitride film 30 to the checking of its section is TIME#3.

In this case, with condition A TIME#1, that is to say, time from the etching of the silicon nitride film 30 to wet cleaning is set to 0 hour and TIME#2, that is to say, time from the wet cleaning to the checking of its section is set to 0 hour. With condition B TIME#1 and TIME#2 are set to 0 hour and 6 hours respectively. With condition C TIME#1 and TIME#2 are set to 6 hours and 0 hour respectively. With the last condition D TIME#1 and TIME#2 are arbitrary and TIME#3 is set to 9 hours.

FIG. 11 is a view showing the width of a side etch which occurs under each condition. As shown in FIG. 11, a side etch is observed only under condition C and is not observed under the other conditions. This shows that a side etch occurs according to the length of time from the etching of the silicon nitride film 30 to wet cleaning.

Conventionally, to prevent corrosion, time after etching the silicon nitride film 30 and before wet cleaning treatment must be managed or semiconductor substrates must be kept in a container filled with dry nitrogen ($N_2$) However, this is troublesome.

SUMMARY OF THE INVENTION

The present invention was made under the background circumstances as described above. An object of the present invention is to prevent a side etch in a method for fabricating a semiconductor device in which a dual damascene method is used so that defective burying of the copper film 38 will be prevented.

In order to achieve the above object, a method for fabricating a semiconductor device comprising a first process for forming a barrier insulating film and an interlayer dielectric in order on a semiconductor substrate, a second process for making a first opening of a hole shaped pattern in the interlayer dielectric, a third process for making a second opening of a wiring shaped pattern in the interlayer dielectric so that at least part of the second opening will overlap with the first opening, a fourth process for making a third opening of a hole shaped pattern in the barrier insulating film by etching the barrier insulating film through the first opening in the interlayer dielectric, and a fifth process performed after the fourth process for removing fluoride which has attached to the barrier insulating film by the use of gas which contains hydrogen atoms is provided.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 4(A) and 4(B) are views for describing a method for fabricating a semiconductor device according to a second embodiment of the present invention.

DESCRIPTION OF THE PREFERRED EMBODIMENTS

Embodiments of the present invention will now be described with reference to the drawings.

Figures 1A, 1B, 1C:
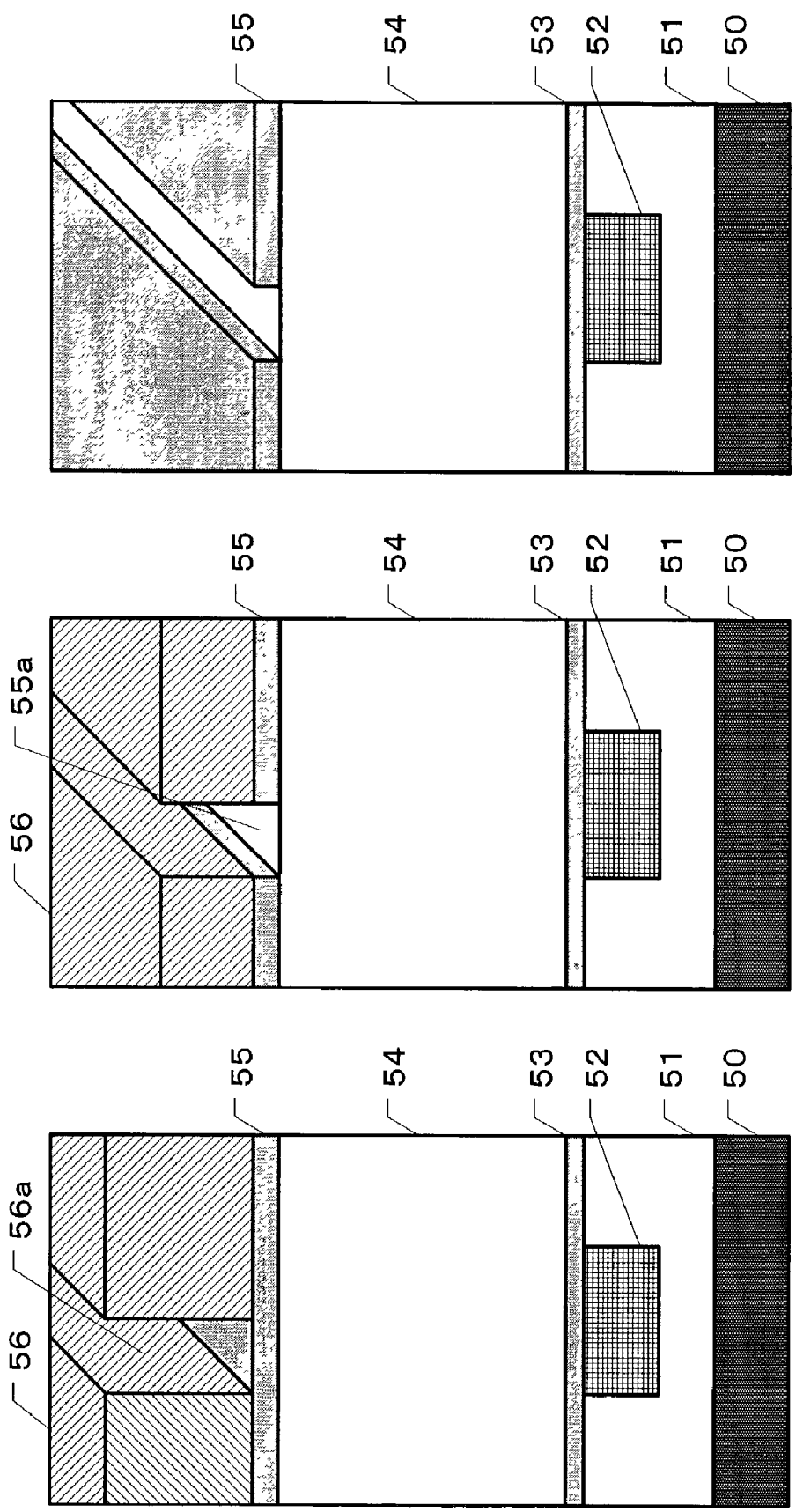
FIGS. 1(A) through 1(I) are views for describing a method for fabricating a semiconductor device according to a first embodiment of the present invention.

FIGS. 1(A), 1(B), and 1(C) are views for describing the details of a method for fabricating a semiconductor device according to a first embodiment of the present invention.

First, in FIG. 1(A), an insulating film 51 in which a copper film 52 is buried, a barrier insulating film 53, an interlayer dielectric 54, and a mask film 55 are formed on a semiconductor substrate 50 and then a resist film 56 with an opening 56a is formed on the mask film 55.

The insulating film 51 consists of a silicon dioxide film, organic insulating film, and the like and the copper film 52 is buried in the insulating film 51 in the following way.

The silicon dioxide film is formed first by a plasma CVD method. The organic insulating film is formed by the use of, for example, Allied-Signal's FLARE 2.0, being an insulating material having a low dielectric constant, by a spin coat method. Allied-Signal's FLARE 2.0 is an aromatic polymer with a dielectric constant of 2.8 lower than 4.1, being the dielectric constant of a silicon dioxide film, and can withstand temperatures higher than 400° C. In this example, Allied-Signal's FLARE 2.0 is used as the organic insulating film. However, Dow Chemical's SiLK, being a hydrocarbonaceous polymer, or the like can be used. Another substance, such as resin which contains hydrocarbon, fluorine, or the like, may be used as the organic insulating film.

First, to form the copper film 52 in the insulating film 51 formed in this way, the insulating film 51 is coated with a photoresist film, being a photosensitive polymer, and a window for a wiring pattern is formed through exposure treatment and development treatment. An opening of a wiring shaped pattern is made in the insulating film 51 through this window by etching, such as a plasma etching method. Then a portion of the insulating film 51 which is exposed from the opening for a wiring is removed by a plasma etching method to make an opening of a wiring shaped pattern. The insulating film 51 is etched in an atmosphere where $O_2$ and Ar gases are introduced. An etchant used in this case is oxygen, so the insulating film 51 and photoresist film are etched selectively. As a result, the etching of the insulating film 51 and the removal of the photoresist film can be performed at one time.

A barrier metal film (not shown) of TiN or TaN, the melting point of which is high, with a thickness of 50 nm is formed by sputtering in an opening (wiring trench) in the insulating film 51 made through the above patterning treatment. Then the copper film 52 with a thickness of 800 nm is formed on the barrier metal film by the same sputtering.

There will be irregularities on the surface of the copper film 52. Therefore, to flatten the surface of the copper film 52, anneal treatment is performed on the copper film 52 at 400° C. in an atmosphere of hydrogen at a pressure of 0.1 torr for five minutes. As a result of this anneal treatment, the copper film 52 will completely be buried in the wiring trench.

And then the copper film 52 is polished by a chemical mechanical polishing method to leave the copper film 52 only in the wiring trench. This copper film 52 is a first wiring layer.

Subsequently a plurality of films, such as insulating films and metal films, described below are formed on the copper film 52 and insulating film 51. That is to say, the barrier insulating film (silicon nitride film, for example) 53 with a thickness of 50 nm is formed on the copper film 52 and insulating film 51. The interlayer dielectric 54 which consists of a silicon dioxide film, organic insulating film, and the like is formed on the barrier insulating film 53. In this case, the silicon dioxide film is formed by a plasma CVD method and the organic insulating film is formed by a spin coat method. One of the above materials will be selected for forming the organic insulating film.

Then the mask film (silicon nitride film, for example) 55 with a thickness of 100 nm is formed on the interlayer dielectric 54 by a plasma CVD method.

After these films are formed, the resist film 56 is formed on the mask film 55. Exposure treatment and development treatment are performed on the resist film 56 to make an opening 56a.

A structure shown in FIG. 1(A) will be obtained through the above process.

Subsequently an opening for a wiring 55a having a shape corresponding to a second wiring layer is made in the mask film 55 by a photolithographic method in which the resist film 56 is used as a mask (see FIG. 1(B)).

Subsequently, as shown in FIG. 1(C), the mask film 55 is ashed by oxygen plasma and is removed.

Figure 1D:
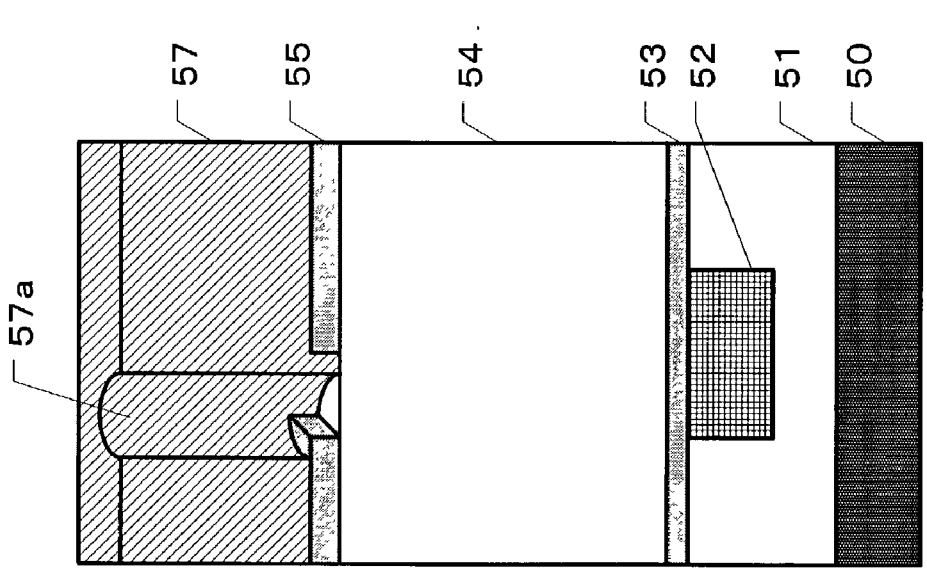

Subsequently, as shown in FIG. 1(D), the surface of the mask film 55 and the inside of the opening 55a are coated with a photoresist film 57 and exposure treatment and development treatment are performed on the photoresist film 57 to form a window 57a, which is in the opening for a wiring 55a and which is opposite to part of the first wiring layer, in the photoresist film 57. The window 57a has a shape corresponding to a contact via.

Figure 1E:
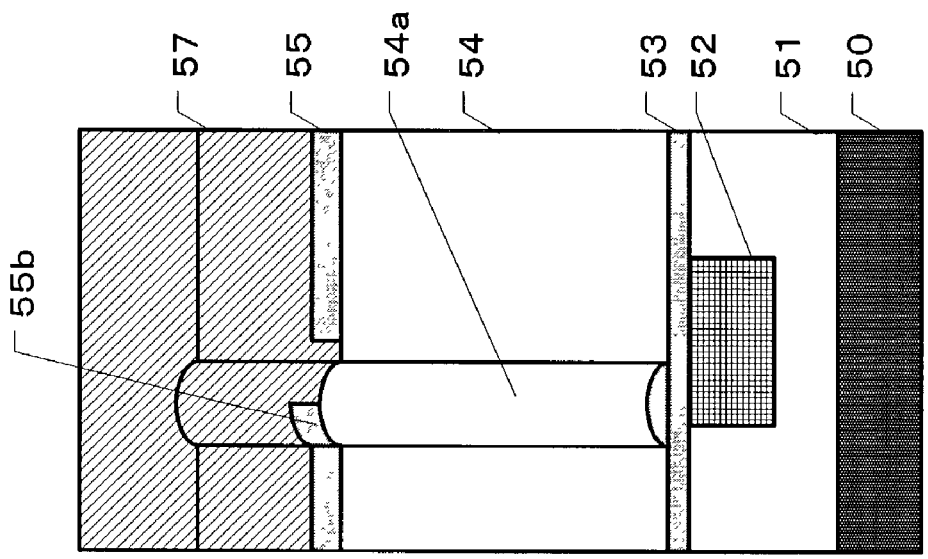

After that, as shown in FIG. 1(E), the interlayer dielectric 54 is etched through the window 57a in the photoresist film 57 to make a hole opening 54a having a shape corresponding to the contact via.

Figure 1F:
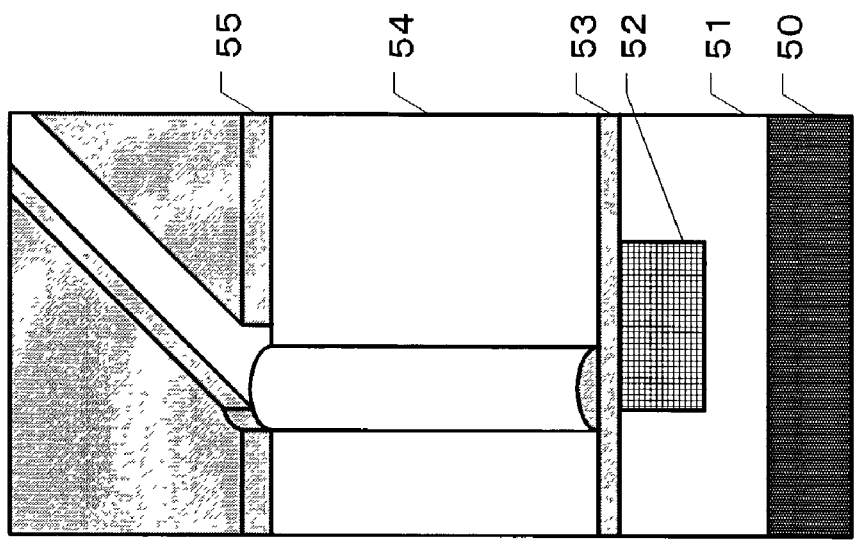

Subsequently, as shown in FIG. 1(F), anisotropic plasma etching is performed by the use of oxygen and argon to remove the photoresist film 57.

Figure 1I:
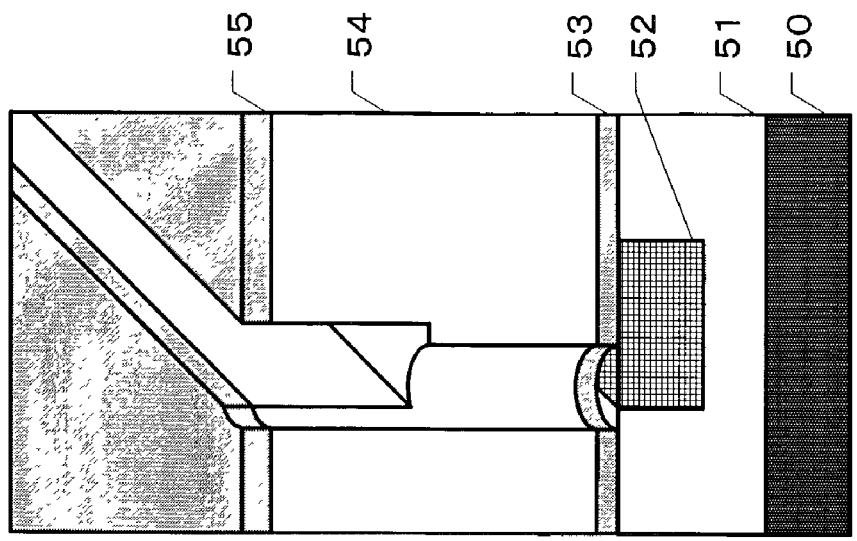
Figure 1H:
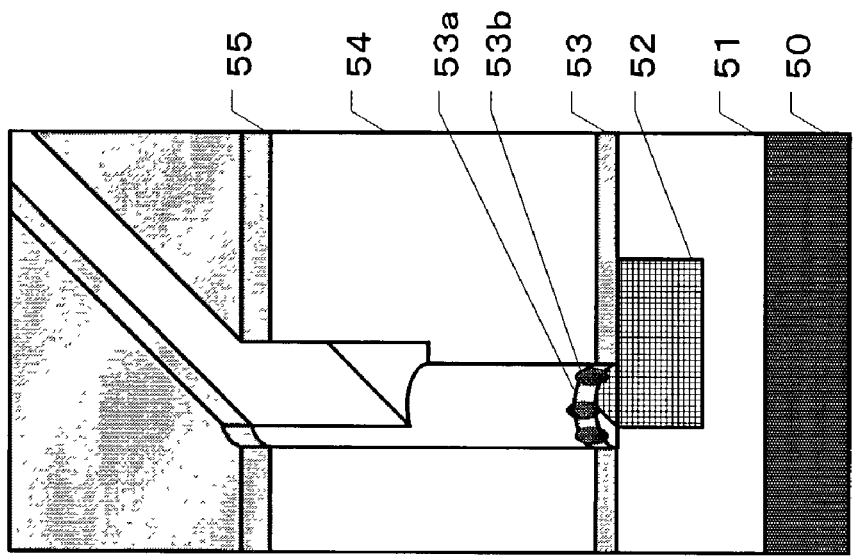
Figure 1G:
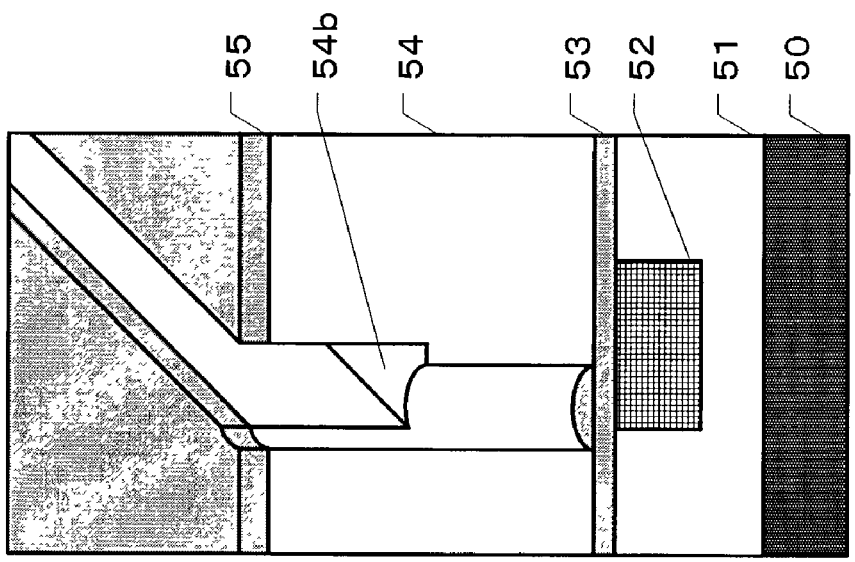

Subsequently, as shown in FIG. 1(G), the interlayer dielectric 54 is etched through the opening 55a into the shape of a wiring by plasma etching using gas which contains fluorine with the mask film 55 as a mask to make an opening 54b. The opening 54b will be used as a wiring trench in the wiring layer.

Subsequently, as shown in FIG. 1(H), plasma etching is performed on the barrier insulating film 53 beneath the opening 54a by the use of $C_5F_8$ gas, $CH_2F_2$ gas, and $O_2$ gas with the interlayer dielectric 54 as a mask to make an opening 53a there. The opening 53a in the barrier insulating film 53 and the opening 54a in the interlayer dielectric 54 are used as a contact via hole and part of wirings on the first wiring layer will get exposed in the bottom of the contact via hole.

At this time $CF_x$ 53b produced when the preceding plasma etching was performed has attached to the periphery of the opening 53a. The $CF_x$ 53b will cause a side etch.

In the present invention, the treatment of removing the $CF_x$ 53b by plasma of gas (such as $H_2$ or $NH_3$) which contains hydrogen atoms is performed in a process shown in FIG. 1(I) just after the etching of the barrier insulating film 53 shown in FIG. 1(H) is completed.

Figure 2:
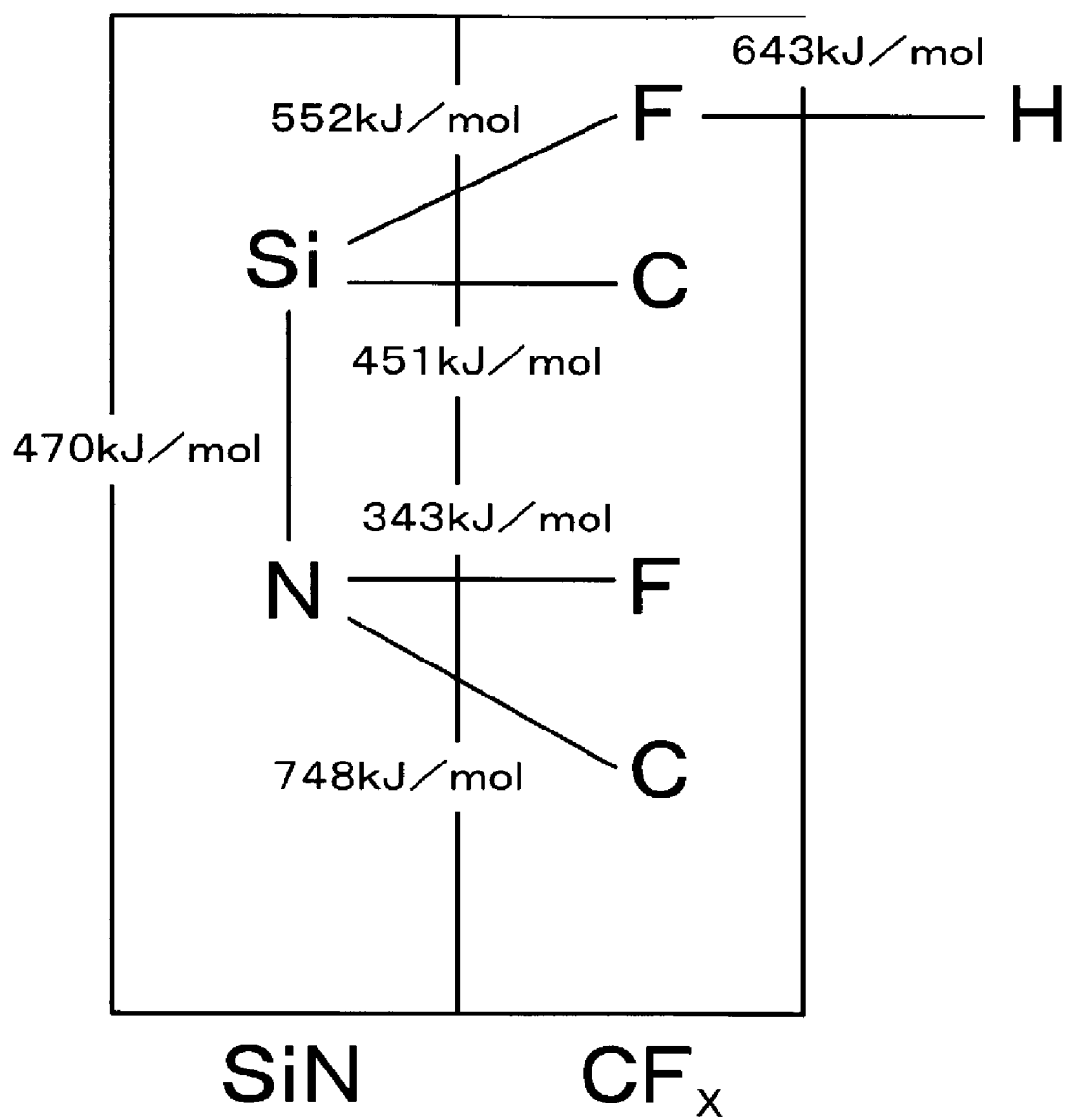
FIG. 2 is a view showing bond energy between each of atoms contained in a barrier insulating film and each of the atoms contained in $CF_x$.

FIG. 2 is a view showing bond energy between each of the atoms contained in silicon nitride (SiN) contained in the barrier insulating film 53 and each of the atoms contained in the $CF_x$ 53b. As shown in FIG. 2, bond energy between fluorine (F), from which hydrogen fluoride (HF) is produced, and silicon (Si) is 552 kJ/mol and bond energy between fluorine and nitrogen (N) is 343 kJ/mol. These values are smaller than bond energy between fluorine and hydrogen (H), being 643 kJ/mol. Therefore, by performing treatment with plasma which contains hydrogen atoms, fluorine contained in $CF_x$ is let loose and hydrogen fluoride gas, the boiling point of which is low, is produced. As a result, the fluorine contained in the $CF_x$ can be removed.

Gas other than hydrogen gas which contains hydrogen atoms may be used. For example, if ammonia ($NH_3$) gas is used, hydrogen atoms combine with fluorine atoms and stable nitrogen gas remains. This nitrogen gas let loose prevents an unnecessary chemical change. A mixed gas which contains hydrogen gas and ammonia gas may be used.

Figure 3:
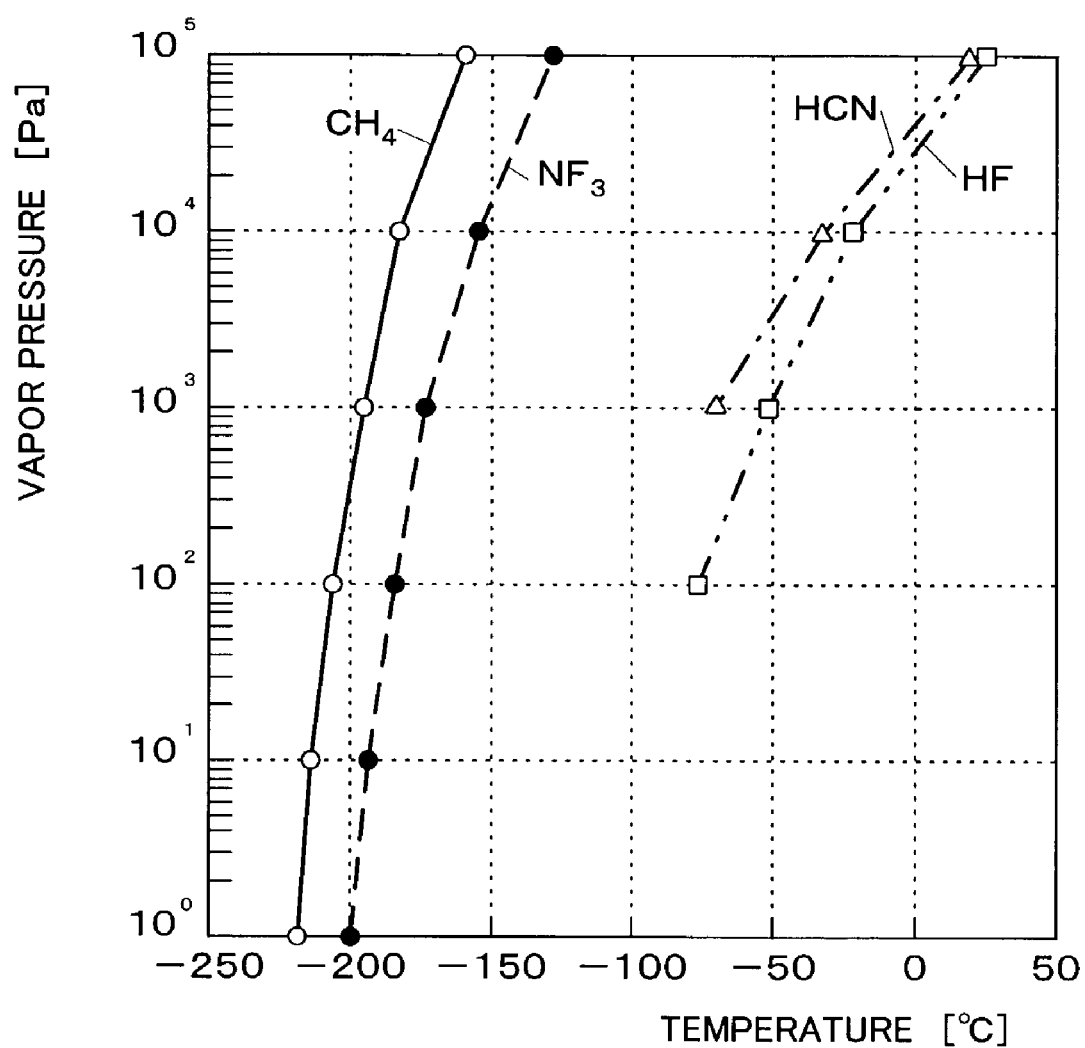
FIG. 3 is a view for describing vapor pressure by compounds produced by plasma treatment using hydrogen gas or ammonia gas.

FIG. 3 shows vapor pressure by compounds which will be produced when etching is performed by the use of hydrogen gas or ammonia gas. In this example, methane ($CH_4$) gas, nitrogen trifluoride ($NF_3$), hydrogen cyanide (HCN), and hydrogen fluoride (HF) are shown. Etching treatment will be performed in the environment of about 10 Pa (which is approximately equals to 0.1 torr) and 0° C. As is seen from FIG. 3, all of these compounds are in a gaseous state under this condition. Therefore, the compounds produced as a result of treatment with hydrogen gas will become gaseous and be removed quickly. This prevents the barrier insulating film 53 from being corroded in wet treatment performed later.

In other words, by performing treatment with hydrogen gas, the $CF_x$ 53b produced on the barrier insulating film 53 can be removed reliably and the occurrence of a side etch can be prevented reliably.

It is preferable that this treatment with hydrogen gas should be performed in the same chamber where the treatment shown in FIG. 1(H) was performed. This will obviate the need for managing time before wet cleaning treatment or keeping semiconductor substrates in a container filled with dry $N_2$.

Treatment performed after the treatment shown in FIG. 1(I) is the same as that in conventional methods, so descriptions of it will be omitted.

In the above embodiment, corrosion of the barrier insulating film 53 by the $CF_x$ 53b and therefore the creation of a void can be prevented effectively. As a result, defective burying of a copper film can be prevented.

Especially if the barrier insulating film 53 is formed by a plasma CVD method, it contains many impurities, such as hydrogen atoms, and tends to react chemically with the $CF_x$ 53b. By applying the present invention to such a case, good results can be obtained.

Figure 9:
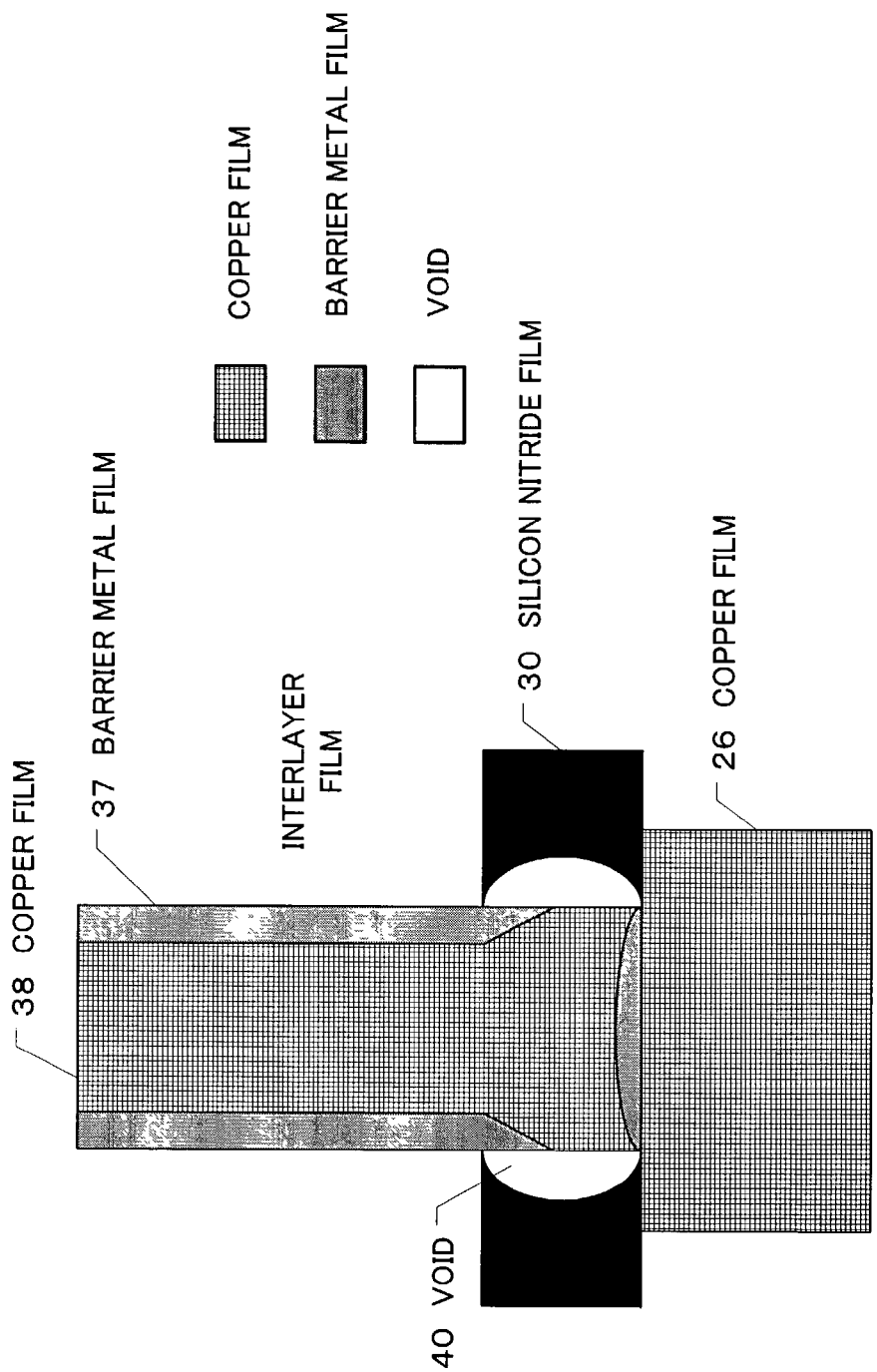
FIG. 9 is a view for describing a void created in a silicon nitride film.
Figures 10A, 10B:
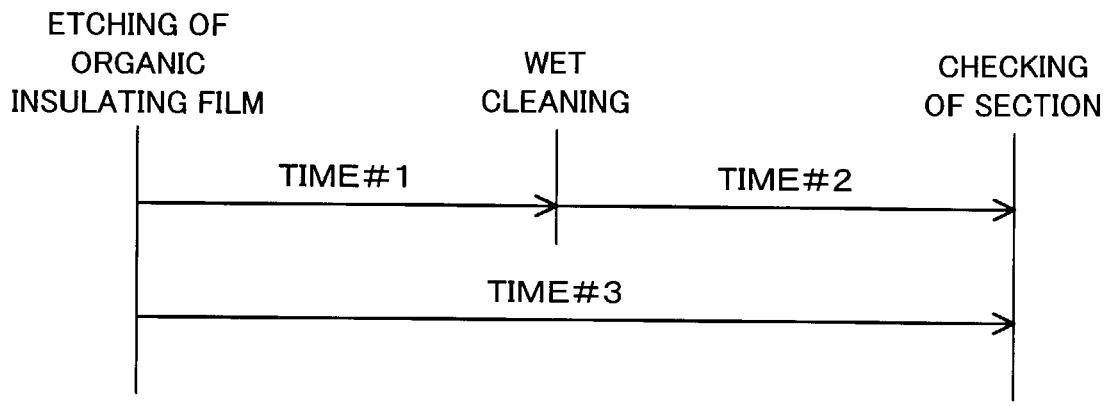
FIG. 10(A) is a view showing the definitions of TIME#1 through #3 shown in FIG. 10(B) and FIG. 10(B) is a view showing conditions under which semiconductor devices are produced.
Figure 11:
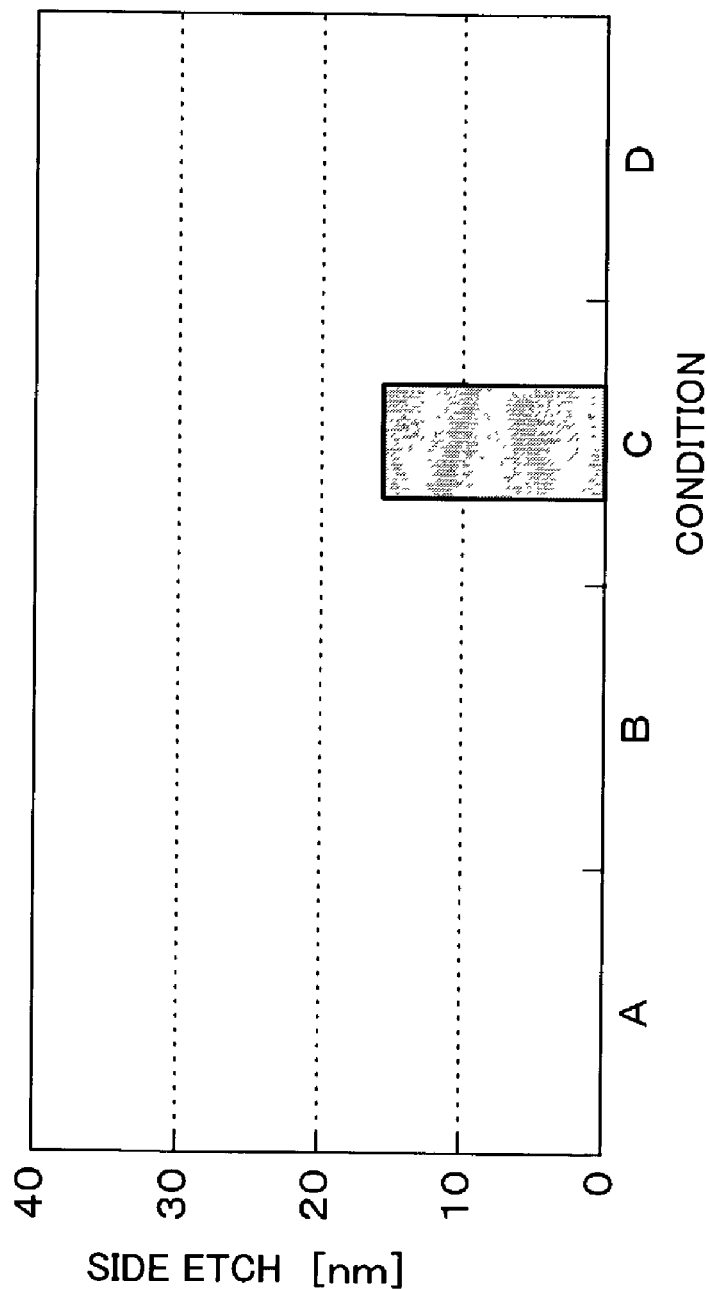
FIG. 11 is a view showing the width of a side etch in a semiconductor device produced under each of the conditions shown in FIG. 10(B).

Moreover, as described later, control should be exercised over the barrier insulating film 53 in the process shown in FIG. 1(H) by setting bias power to a value lower than usual or setting the temperature of a stage on which the silicon substrate 50 is placed to a low value so that the barrier insulating film 53 in the shape of a taper will spread toward the silicon substrate 50 (see FIG. 9 described later). By doing so, the coverage of a barrier metal film can be raised and reliability can be improved.

Now, a second embodiment of the present invention will be described.

FIGS. 4(A) and 4(B) are views for describing the details of a method for fabricating a semiconductor device according to a second embodiment of the present invention.

Processes from the beginning to FIG. 1(F) are the same as those in the first embodiment, so descriptions of them will be omitted.

As shown in FIG. 1(F), in the second embodiment anisotropic plasma etching is performed by the use of oxygen and argon to remove the photoresist film 57. Then, as shown in FIG. 4(A), plasma etching is performed on the barrier insulating film 53 beneath the opening 54a by the use of $C_4F_8$ gas and $O_2$ gas with the interlayer dielectric 54 as a mask to make an opening 53a there. The opening 53a in the barrier insulating film 53 and the opening 54a in the interlayer dielectric 54 are used as a contact via hole and part of wirings on the first wiring layer will get exposed in the bottom of the contact via hole.

At this time $CF_x$ 53b produced when the plasma etching was performed has attached to the periphery of the opening 53a.

Subsequently, as shown in FIG. 4(B), the interlayer dielectric 54 is etched through the opening 55a into the shape of a wiring by plasma etching using hydrogen gas with the mask film 55 as a mask to make an opening 54b. The opening 54b will be used as a wiring trench in the wiring layer. Even if an organic insulating film is included in the interlayer dielectric 54, the interlayer dielectric 54 can be etched effectively by using ammonia gas instead of hydrogen gas.

When the interlayer dielectric 54 is etched by hydrogen gas or ammonia gas, the $CF_x$ 53b produced in the process shown in FIG. 4(A) is converted into a volatile gas and can be removed at one time. As a result, compared with the first embodiment, the number of fabricating processes can be reduced by one.

Fabricating processes performed after the one shown in FIG. 4(B) are the same as those in conventional methods, so descriptions of them will be omitted.

As described above, in the second embodiment of the present invention, the treatment of etching the barrier insulating film 53 is performed before etching treatment to form the opening 54b. As a result, the formation of the opening 54b and the removal of the $CF_x$ 53b can be performed at one time. A side etch therefore can be prevented without increasing the number of fabricating processes.

By the way, when plasma etching is performed by the use of hydrogen gas, ammonia gas, or the like in the first and second embodiments, corrosion of wiring trenches or via holes can be prevented by setting bias power to a value smaller than usual. Setting bias power to a small value will not have a great influence on efficiency in the removal of the $CF_x$ 53b because of high bond energy between hydrogen atoms and fluorine atoms.

Figure 5:
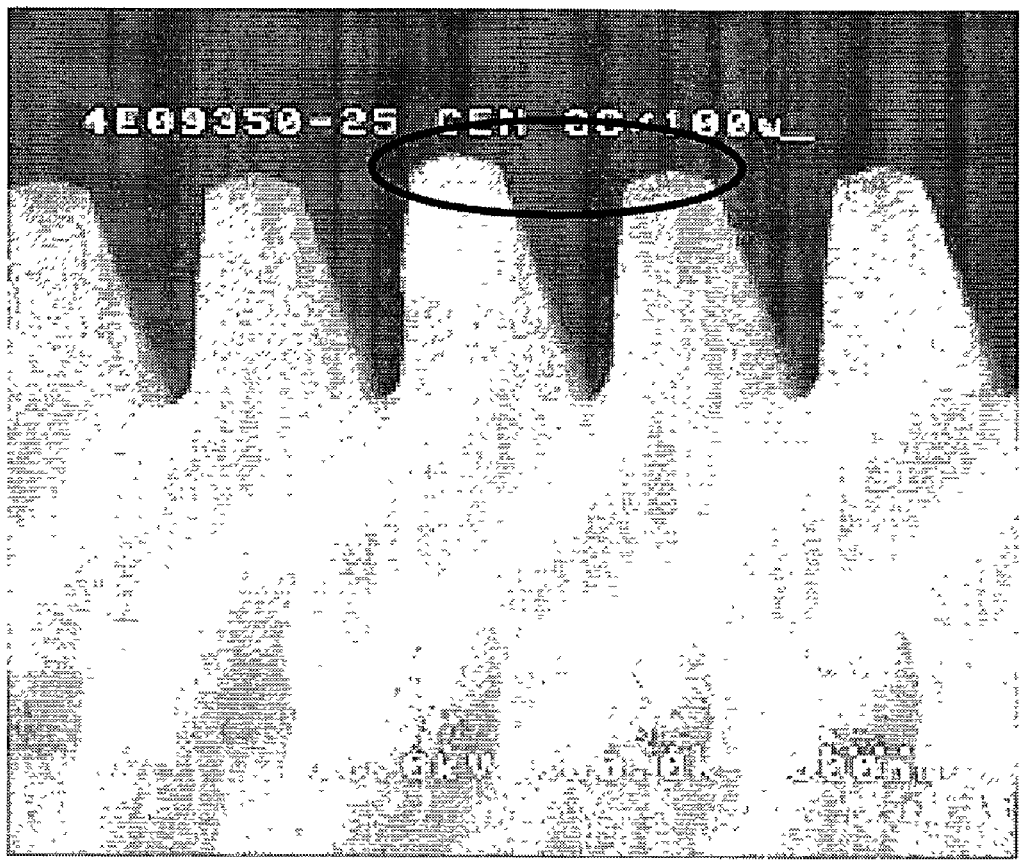
FIG. 5 is a view showing an actual semiconductor device obtained by setting bias power to a value smaller than or equal to 100 W in the case of performing plasma treatment with a hydrogen gas.
Figure 6:
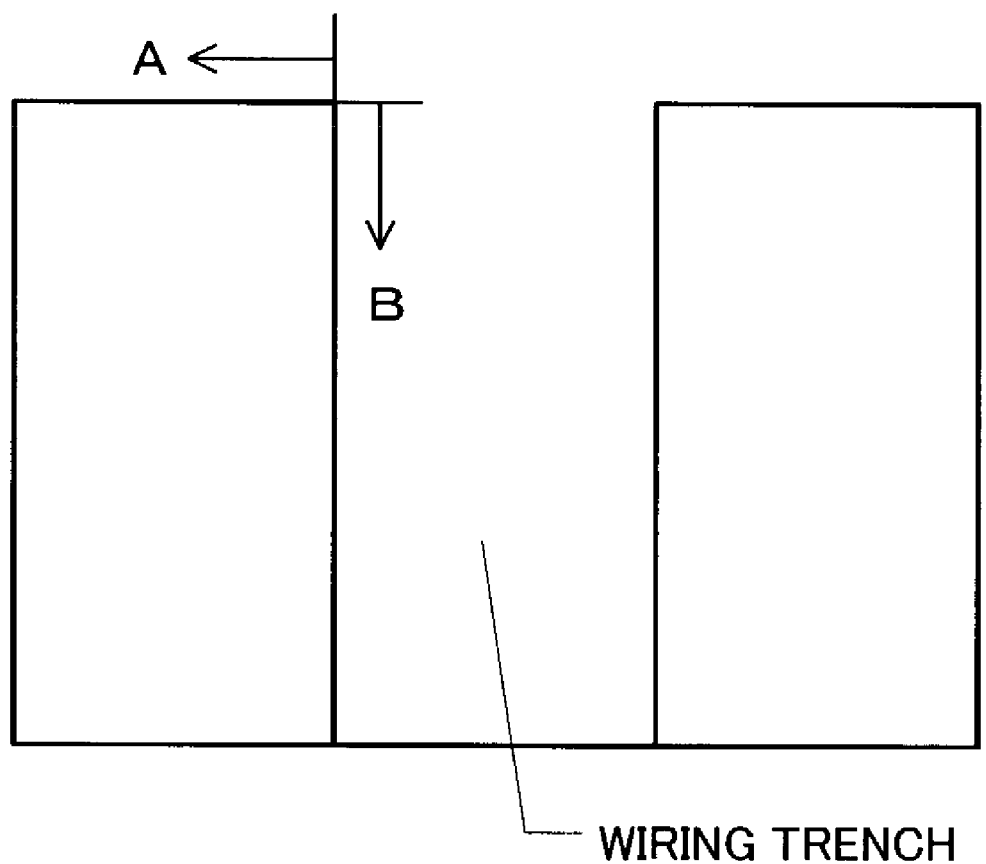
FIG. 6 is a view for describing the recession length of a wiring trench.

Our actual experiments have shown that if bias power is set to 100 W, the recession length of the shoulder of a wiring trench can be held down to a value smaller than or equal to 5 nm. FIG. 5 is a sectional view of actual wiring trenches and a portion enclosed with a circle corresponds to one wiring trench. FIG. 6 is a view for simply describing the portion enclosed with a circle in FIG. 5. As shown in FIG. 6, the shoulder of the wiring trench will recede in two directions, that is to say, in A and B directions. The fact that if bias power is set to 100 W, the recession length in the two directions of the shoulder of the wiring trench is held down to a value smaller than or equal to 5 nm has been confirmed by our experiments.

Moreover, our experiments have shown that the coverage of a barrier metal film can be raised by setting bias power to a value (100 W, for example) lower than usual or setting the temperature of a stage on which the silicon substrate 50 is placed to a low value (0° C., for example) in the case of performing plasma etching by the use of hydrogen gas, ammonia gas, or the like in the first and second embodiments.

Figure 7:
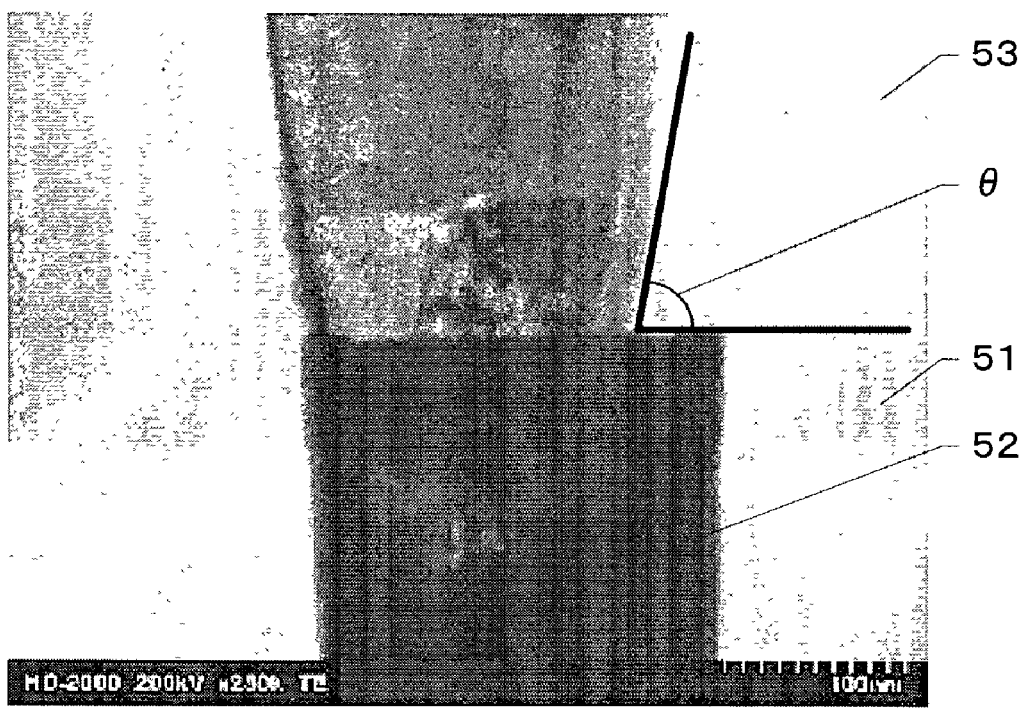
FIG. 7 is a view showing an actual semiconductor device obtained by setting bias power for etching a barrier insulating film to a value smaller than or equal to 100 W before performing plasma treatment with a hydrogen gas.
Figure 8C:
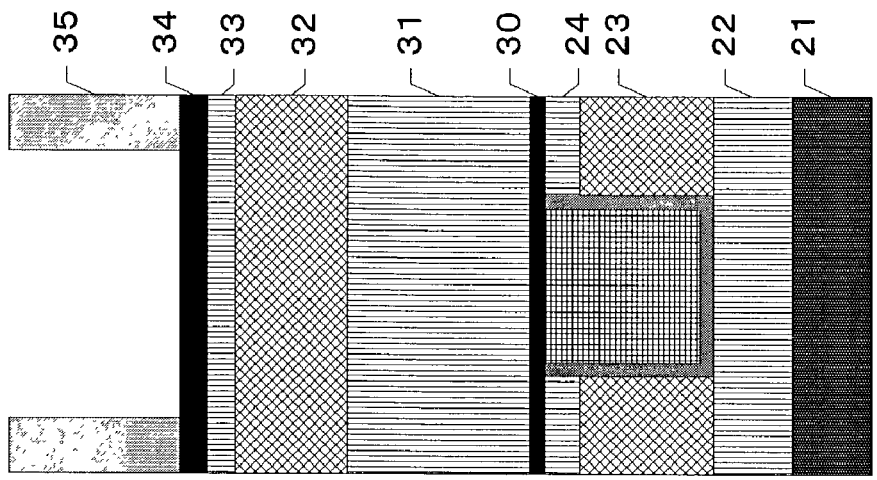
FIGS. 8(A) through 8(M) are views showing a conventional method for fabricating a semiconductor device.
Figure 8B:
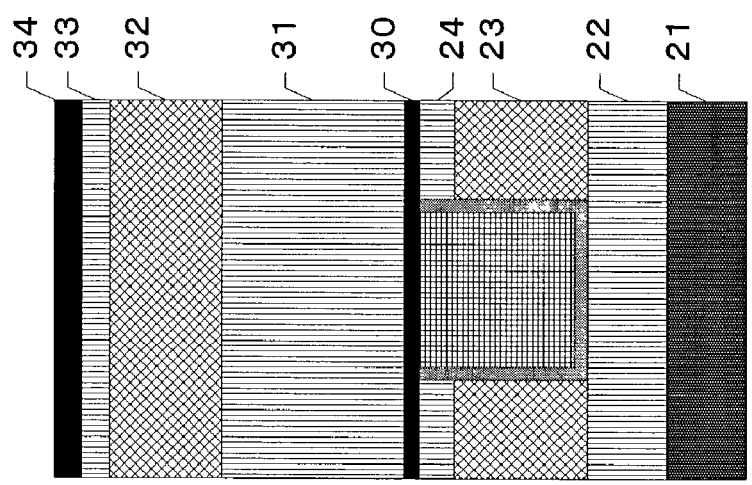
Figure 8A:
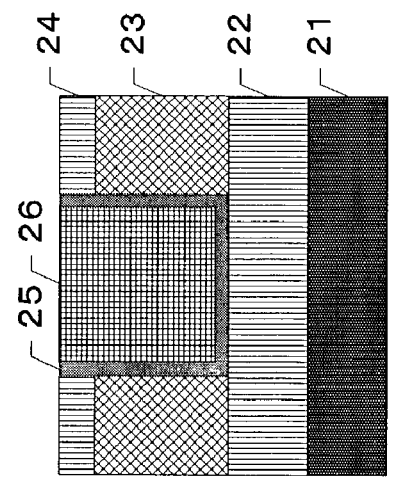
Figure 8F:
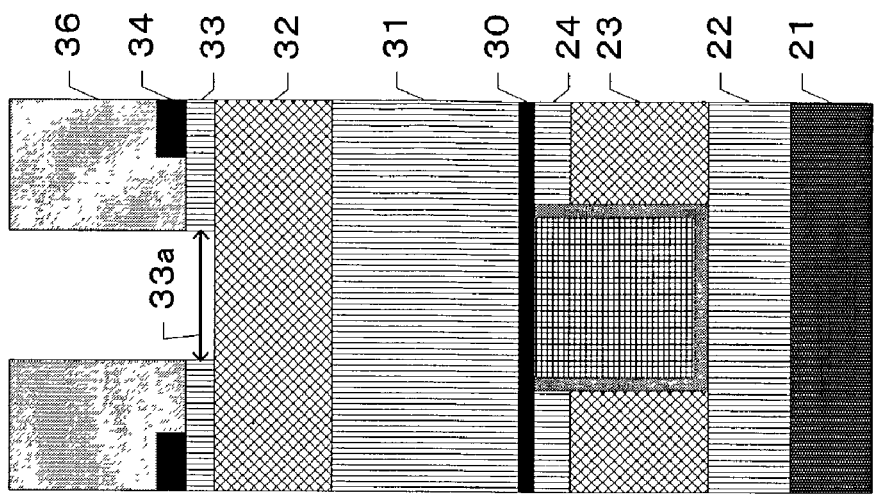
Figure 8E:
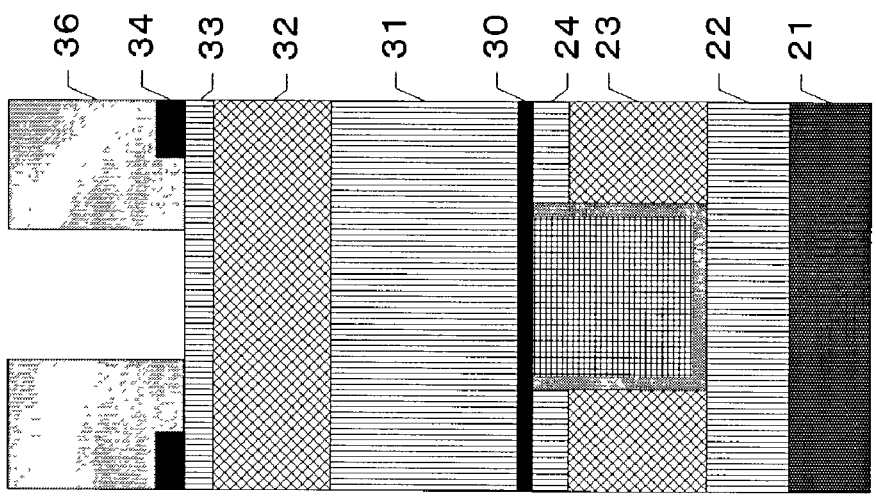
Figure 8D:
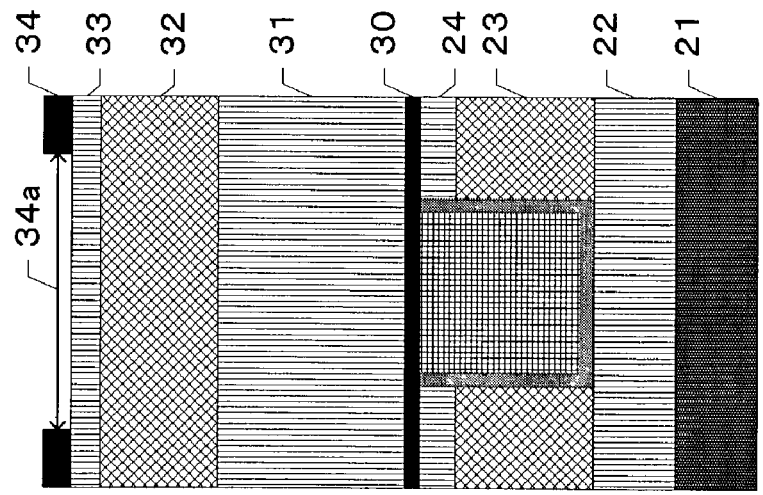
Figure 8I:
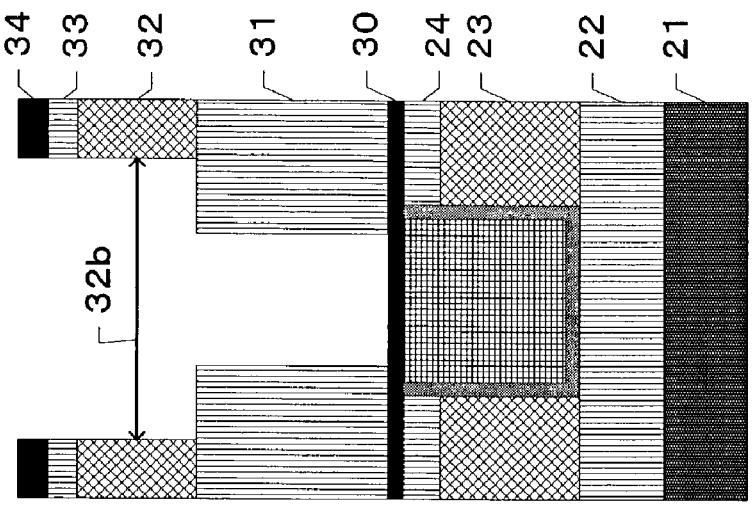
Figure 8H:
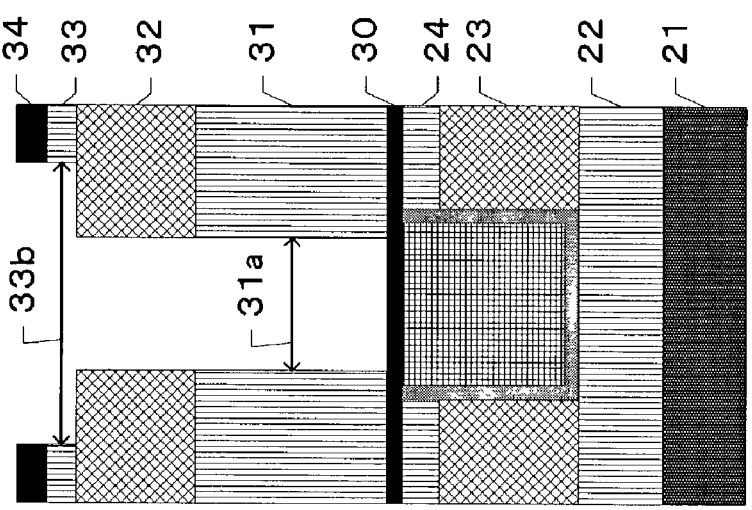
Figure 8G:
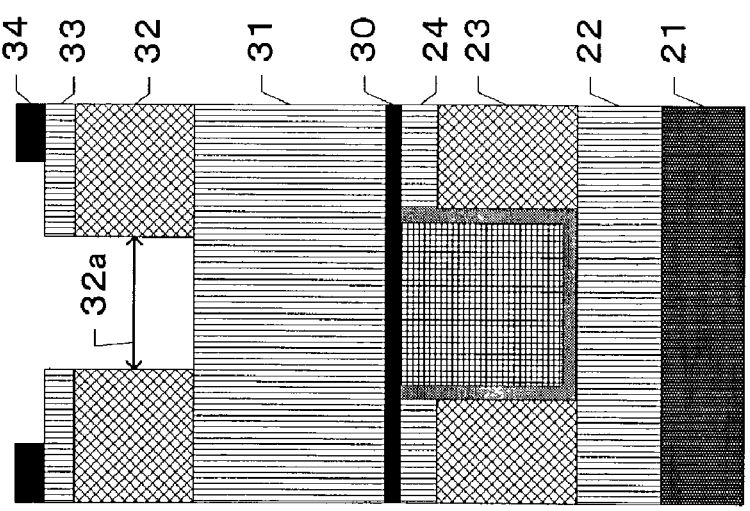
Figure 8L:
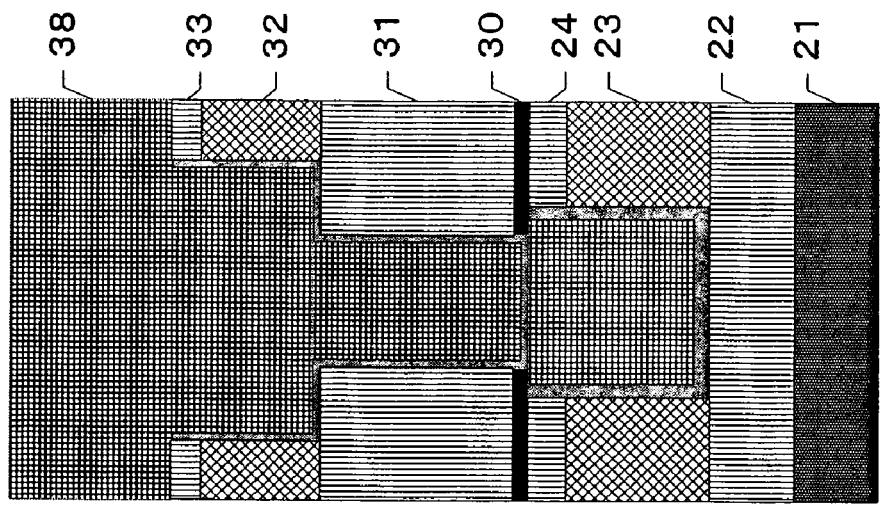
Figure 8K:
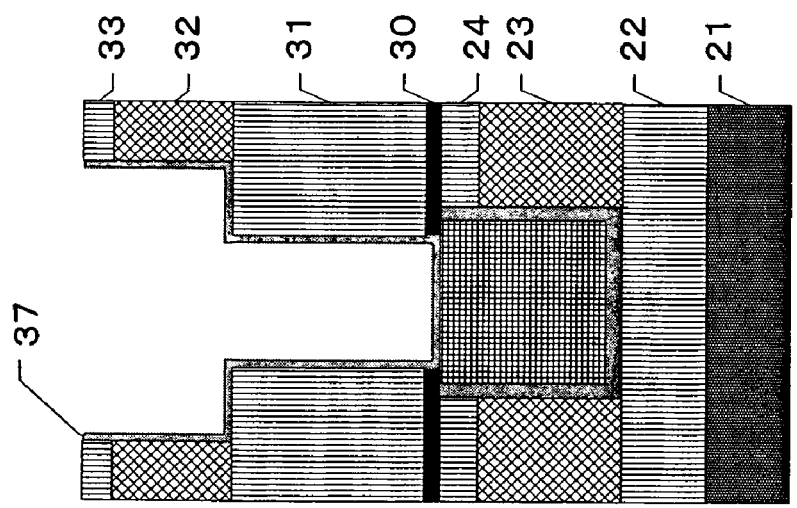
Figure 8J:
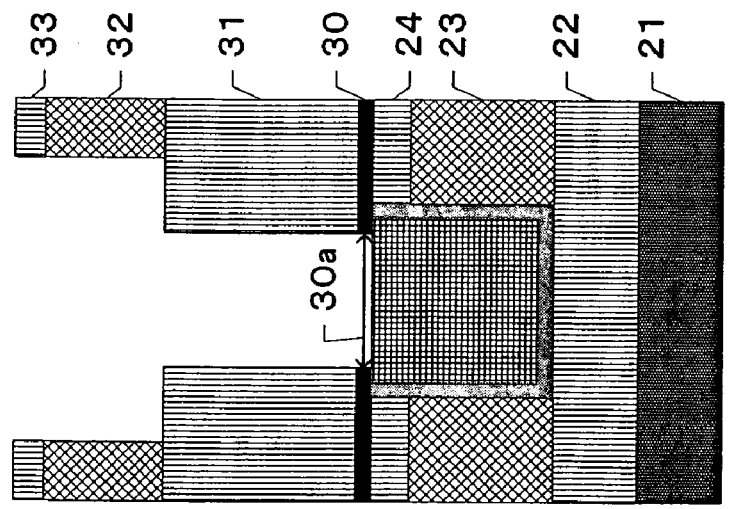
Figure 8M:
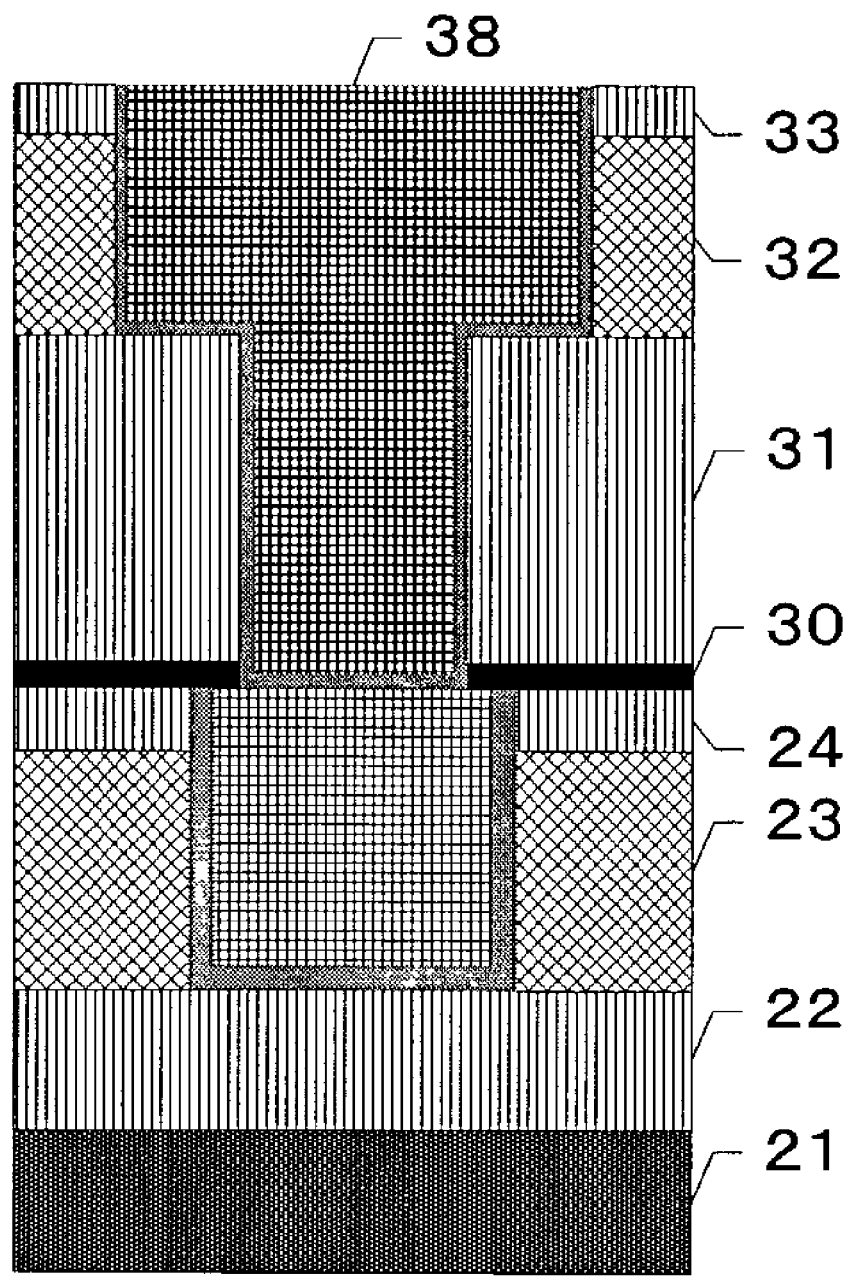

FIG. 7 is a photograph of a real semiconductor device obtained by our experiment and is an enlarged view of portions near the border between the copper film 52 and the barrier insulating film 53. As shown in FIG. 7, by setting bias power for plasma to a value lower than or equal to 100 W in the case of etching the barrier insulating film 53, the angle θ of a taper of the barrier insulating film 53 can be made a value smaller than or equal to 85 degrees. As a result, the coverage of a barrier metal film can be raised.

In addition, the recession length of a wiring trench can be held down and a reduction in the thickness of the copper film 52 can be held down to a value smaller than or equal to 20 nm.

In the above first and second embodiments, the interlayer dielectric 54 which consists of a single member was illustrated as an example. However, it is a matter of course that the present invention is applicable to cases where the interlayer dielectric 54 consists of a plurality of members (a silicon dioxide film and organic insulating film, for example).

As has been described in the foregoing, a method for fabricating a semiconductor device according to the present invention comprises a first process for forming a barrier insulating film and an interlayer dielectric in order on a semiconductor substrate, a second process for making a first opening of a hole shaped pattern in the interlayer dielectric, a third process for making a second opening of a wiring shaped pattern in the interlayer dielectric so that at least part of the second opening will overlap with the first opening, a fourth process for making a third opening of a hole shaped pattern in the barrier insulating film by etching the barrier insulating film through the first opening in the interlayer dielectric, and a fifth process performed after the fourth process for removing fluoride which has attached to the barrier insulating film by the use of gas which contains hydrogen atoms. This prevents a void from being created.

Furthermore, a method for fabricating a semiconductor device according to the present invention comprises a first process for forming a barrier insulating film and an interlayer dielectric in order on a semiconductor substrate, a second process for making a first opening of a hole shaped pattern in the interlayer dielectric, a third process for making a second opening of a hole shaped pattern in the barrier insulating film by etching the barrier insulating film through the first opening in the interlayer dielectric, and a fourth process performed after the third process for removing fluoride which has attached to the barrier insulating film by the use of gas which contains hydrogen atoms and for making a third opening of a wiring shaped pattern in the interlayer dielectric so that at least part of the third opening will overlap with the first opening. This prevents a side etch effectively without increasing the number of production processes.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device, the method comprising:
   - a first process for forming a barrier insulating film which contains hydrogen atoms and an interlayer dielectric which includes an organic insulating film in order on a semiconductor substrate;
   - a second process for making a first opening of a hole shaped pattern in the interlayer dielectric;
   - a third process for making a second opening of a hole shaped pattern in the barrier insulating film which contains the hydrogen atoms by etching the barrier insulating film which contains the hydrogen atoms through the first opening in the interlayer dielectric; and
   - a fourth process performed after the third process for removing fluoride which has attached to the barrier insulating film which contains the hydrogen atoms by the use of ammonia gas and for making a third opening of a wiring shaped pattern in the interlayer dielectric by use of ammonia gas so that at least part of the third opening will overlap with the first opening, wherein the fourth process is performed in the same chamber where the third process is performed, and is performed in an environment of a temperature below or at 0° C.;
   - wherein in the third process the second opening is made so that the angle of a taper of the barrier insulating film will be smaller than or equal to 85 degrees, further wherein in the fourth process the fluoride which has attached to the barrier insulating film is removed so that the recession length of shoulders of the first opening and the third opening after making of the third opening will be shorter than or equal to 5 nm.

2. The method for fabricating a semiconductor device according to claim 1, wherein the barrier insulating film is formed by a plasma CVD method.

3. The method for fabricating a semiconductor device according to claim 1, wherein the fourth process is performed by the use of plasma of gas which contains hydrogen atoms generated by bias power lower than or equal to 100 W or down flow plasma.

4. The method for fabricating a semiconductor device according to claim 1, wherein the fourth process is performed with the semiconductor substrate placed on a stage of the temperature below or at 0° C.

5. The method for fabricating a semiconductor device according to claim 4, wherein in the fourth process the barrier insulating film is etched by the use of plasma generated by bias power lower than or equal to 100 W.

* * * * *